US011984338B2

(12) United States Patent
Oh et al.

(10) Patent No.: US 11,984,338 B2
(45) Date of Patent: May 14, 2024

(54) SUBSTRATE TRANSFER SYSTEM

(71) Applicant: SAMSUNG ELECTRONICS CO., LTD., Suwon-si (KR)

(72) Inventors: Youn Gon Oh, Hwaseong-si (KR); Ji Hun Kim, Uiwang-si (KR); Seung Gu Bang, Osan-si (KR); Sung-Hoon Lee, Suwon-si (KR); Ho Chan Lee, Seoul (KR); Hyeong Seok Choo, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 17/745,595

(22) Filed: May 16, 2022

(65) Prior Publication Data
US 2023/0133865 A1 May 4, 2023

(30) Foreign Application Priority Data

Oct. 25, 2021 (KR) .................. 10-2021-0142403

(51) Int. Cl.
*H01L 21/677* (2006.01)
*B66C 19/00* (2006.01)

(52) U.S. Cl.
CPC .......... *H01L 21/6773* (2013.01); *B66C 19/00* (2013.01); *H01L 21/67736* (2013.01)

(58) Field of Classification Search
CPC .................. B66C 19/00; H01L 21/6773; H01L 21/67736
See application file for complete search history.

(56) References Cited

U.S. PATENT DOCUMENTS

| 8,459,442 | B2 | 6/2013 | Morimoto et al. |
| 8,892,278 | B2* | 11/2014 | Lin ................... H01L 21/67733 |
| | | | 414/592 |
| 8,977,387 | B2 | 3/2015 | Wang et al. |
| 9,245,782 | B2 | 1/2016 | Yoshioka et al. |
| 10,043,699 | B2 | 8/2018 | Li et al. |
| 10,109,516 | B2 | 10/2018 | Fosnight et al. |
| 10,947,041 | B2 | 3/2021 | Motoori |
| 2009/0288931 | A1* | 11/2009 | Oshima ............. H01L 21/67706 |
| | | | 198/607 |

(Continued)

FOREIGN PATENT DOCUMENTS

JP 2006319154 A 11/2006

*Primary Examiner* — Saul Rodriguez
*Assistant Examiner* — Brendan P Tighe
(74) *Attorney, Agent, or Firm* — Fish & Richardson P.C.

(57) ABSTRACT

A substrate transfer system capable of performing efficient distribution exchange between fabricating facilities is provided. The substrate transfer system includes a lower rail, an upper rail which is located above the lower rail from a ground plane, and extends to be parallel to the lower rail, a conveyor which extends to intersect the lower rail and the upper rail, below the lower rail, a first lower transport unit which transports a first carrier along the lower rail and unloads the first carrier onto the conveyor, and a first upper transport unit which transports a second carrier along the upper rail and unloads the second carrier onto the conveyor, wherein the conveyor includes a linear module which moves the first carrier and the second carrier in a linear direction, and a turning module which turns the first carrier and the second carrier.

19 Claims, 16 Drawing Sheets

(56) References Cited

U.S. PATENT DOCUMENTS

| | | | |
|---|---|---|---|
| 2013/0138277 A1* | 5/2013 | Lin | B61B 13/04 |
| | | | 701/19 |
| 2013/0142597 A1* | 6/2013 | Kinugawa | H01L 21/67733 |
| | | | 414/281 |
| 2017/0140966 A1* | 5/2017 | Li | H01L 21/67766 |
| 2019/0291752 A1* | 9/2019 | Takai | B61B 3/02 |
| 2022/0161999 A1* | 5/2022 | Yuasa | H01L 21/67736 |

* cited by examiner

SUBSTRATE TRANSFER SYSTEM

This application claims priority to Korean Patent Application No. 10-2021-0142403, filed on Oct. 25, 2021, and all the benefits accruing therefrom under 35 U.S.C. § 119, the disclosure of which is incorporated herein by reference in its entirety.

BACKGROUND

1. Technical Field

The present inventive concept relates to a substrate transfer system. More specifically, the present inventive concept relates to a substrate transfer system which performs a distribution exchange between fabricating facilities (FAB).

2. Description of the Related Art

In order to transport a substrate (i.e. a semiconductor wafer) in a production line for fabricating a semiconductor element, a transfer system which transports a carrier (for example, Front Opening Unified Pod (FOUP) or a shipping box (Front Opening Shipping Box (FOST)) in which a plurality of substrates are accommodated is adopted. Such a substrate transfer system is gradually being automated using an overhead hoist transport (OHT).

On the other hand, to maximize the capacity to handle different semiconductor elements and an effective area of the equipment, a cluster type/cloud type fabricating facility (Cluster/Cloud FAB) that integrally produces the semiconductor elements by connecting a plurality of fabricating facilities (FAB) to each other is required. However, at present, because the distribution control system divides the control system for each fabricating facility to minimize the production damage due to unexpected sudden failure, there is a problem in direct movement and transport between the fabricating facilities using the distribution transport device. Therefore, an efficient interface zone operation for distribution exchange between fabricating facilities is indispensable.

SUMMARY

Aspects of the present inventive concept provide a substrate transfer system capable of performing efficient distribution exchange between fabricating facilities.

However, aspects of the present inventive concept are not restricted to the exemplary embodiments set forth herein. The above and other aspects of the present inventive concept will become more apparent to one of skill in the art to which the present inventive concept pertains by referencing the detailed description of the present inventive concept given below.

According to an aspect of the present inventive concept, there is provided a substrate transfer system comprising a lower rail, an upper rail which is located above the lower rail from the ground, and extends to be parallel to the lower rail, a conveyor which extends to intersect the lower rail and the upper rail, below the lower rail, a first lower transport unit which transports a first carrier along the lower rail and unloads the first carrier onto the conveyor, and a first upper transport unit which transports a second carrier along the upper rail and unloads the second carrier onto the conveyor, wherein the conveyor includes a linear module which moves the first carrier and the second carrier in a linear direction, and a turning module which turns the first carrier and the second carrier.

According to an aspect of the present inventive concept, there is provided a substrate transfer system comprising a lower rail, a lower transport unit which transports a first carrier along the lower rail, an upper rail which is placed above the lower rail from a ground and overlaps the lower rail in a vertical direction, an upper transport unit which transports a second carrier along the upper rail, and a conveyor on which the first carrier and the second carrier are loaded or unloaded, below the lower rail, wherein the lower transport unit includes a first grip portion which moves in the vertical direction to perform a loading operation or an unloading operation on the first carrier, and the upper transport unit includes a second grip portion which moves in the vertical direction to perform the loading operation or the unloading operation on the second carrier, and a slider which slides the second grip portion so as not to overlap the lower rail.

According to an aspect of the present inventive concept, there is provided a substrate transfer system comprising a first fabricating facility, a second fabricating facility, and an interface zone which connects the first fabricating facility and the second fabricating facility, wherein the interface zone includes a conveyor, a lower rail which intersects the conveyor, a first lower transport unit which transports a first carrier from the first fabricating facility along the lower rail and unloads the first carrier onto the conveyor, a second lower transport unit which loads the first carrier from the conveyor, and transports the first carrier to the second fabricating facility along the lower rail, an upper rail which is placed above the lower rail from a ground and overlaps the lower rail in a vertical direction, a first upper transport unit which transports a second carrier from the first fabricating facility along the upper rail and unloads the second carrier onto the conveyor, and a second upper transport unit which loads the second carrier from the conveyor and transports the second carrier to the second fabricating facility along the upper rail, wherein the conveyor includes a linear module which moves the first carrier and the second carrier in a linear direction, and a turning module which turns the first carrier and the second carrier.

BRIEF DESCRIPTION OF THE DRAWINGS

The above and other aspects and features of the present inventive concept will become more apparent by describing in detail exemplary embodiments thereof with reference to the attached drawings, in which.

DETAILED DESCRIPTION OF THE PREFERRED EMBODIMENTS

In the present specification, although terms such as first and second are used to describe various elements or components, it goes without saying that these elements or components are not limited by these terms in any numerical sense. These terms are only used to distinguish a single element or component from other elements or components. Therefore, it goes without saying that a first element or component referred to below may be a second element or component within the present inventive concept.

Hereinafter, a substrate transfer system according to exemplary embodiments will be described referring to FIGS. 1 to 16.

Figure 1:
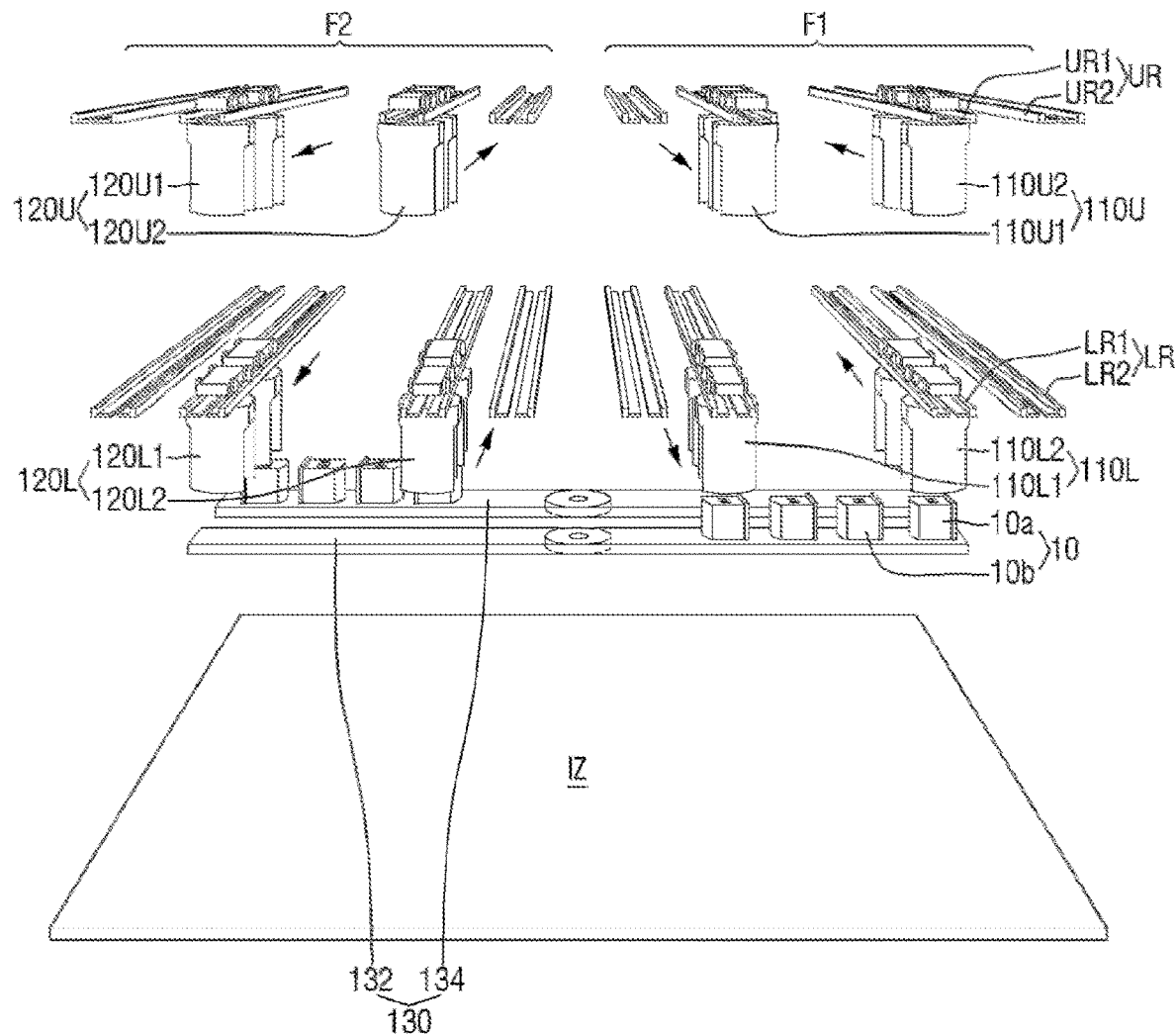
FIG. 1 is a schematic diagram for describing the substrate transfer system according to some exemplary embodiments.
Figure 2:
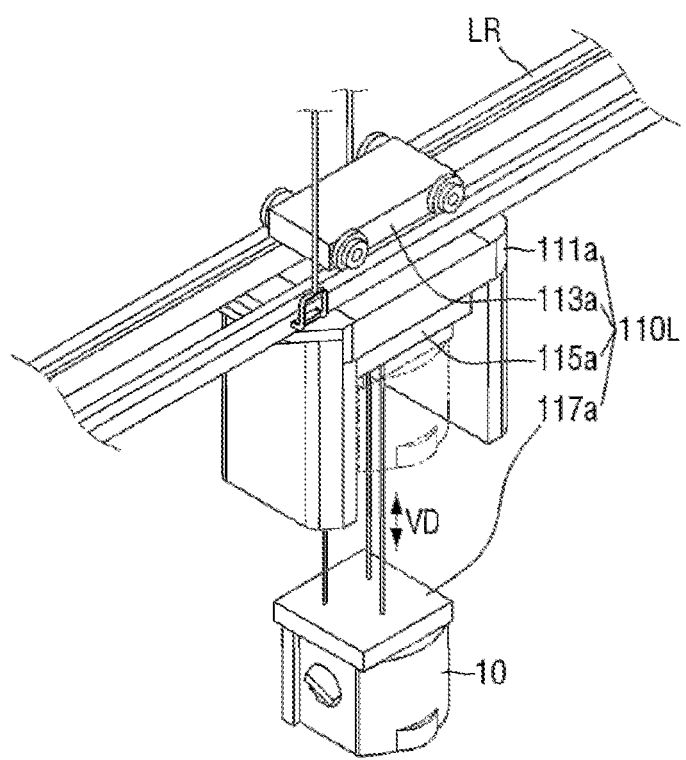
FIG. 2 is a schematic diagram for describing a lower transport unit of FIG. 1.
Figure 3:
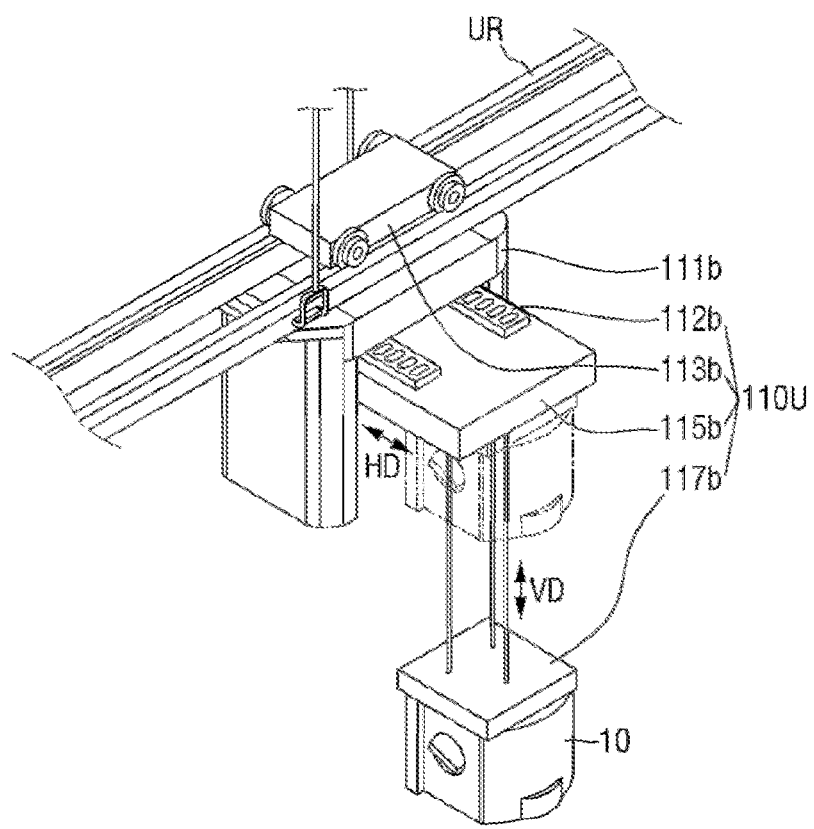
FIG. 3 is a schematic diagram for describing an upper transport unit of FIG. 1.
Figure 4:
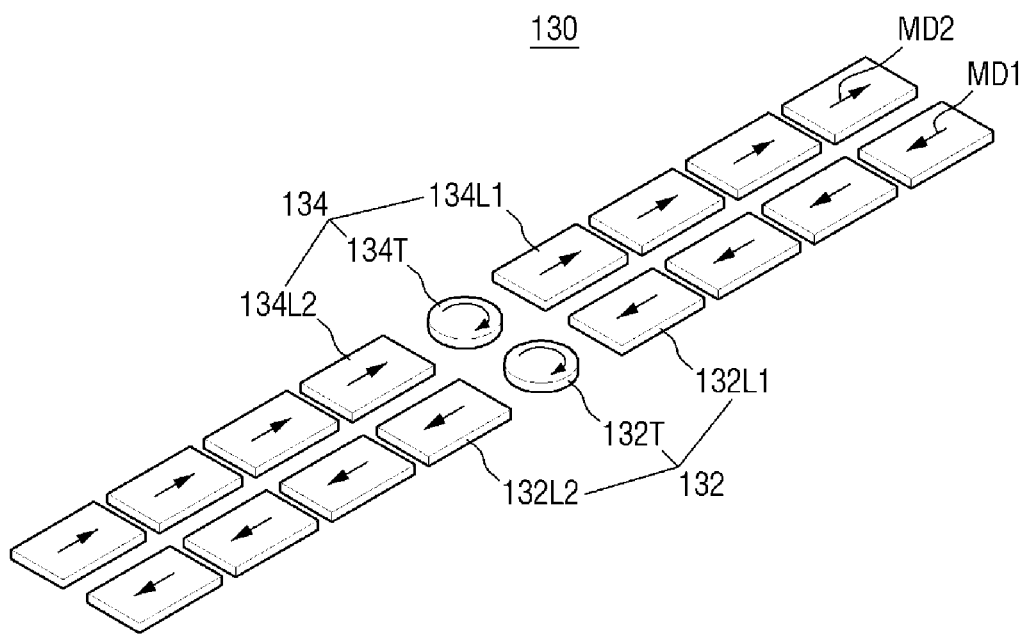
FIG. 4 is a schematic diagram for describing a conveyor of FIG. 1.

FIG. 1 is a schematic diagram for describing the substrate transfer system according to some exemplary embodiments. FIG. 2 is a schematic diagram for describing a lower transport unit of FIG. 1. FIG. 3 is a schematic diagram for describing an upper transport unit of FIG. 1. FIG. 4 is a schematic diagram for explaining a conveyor of FIG. 1.

Referring to FIGS. 1 to 4, the substrate transfer system according to some exemplary embodiments includes an interface zone IZ.

The interface zone IZ may be a zone in which the distribution exchange between fabricating facilities FAB is performed. For example, the interface zone IZ which connects a first fabricating facility F1 and a second fabricating facility F2 may be provided. Such an interface zone IZ may exchange the carriers 10 of the first fabricating facility F1 and the carriers 10 of the second fabricating facility F2 with each other. The carriers 10 may be, but are not limited to, a front opening unified pod (FOUP) or a shipping box (front opening shipping box (FOSB)) in which a plurality of substrates (i.e, semiconductor wafers) are accommodated.

Although not specifically shown, the first fabricating facility F1 and the second fabricating facility F2 may each include a series of processing equipment for fabricating semiconductor elements. The processing equipment may include, for example, etching processing equipment, deposition processing equipment, ashing processing equipment, a cleaning process equipment, and the like. Each processing equipment is provided with a substrate (i.e., a semiconductor wafer) from the carrier 10 and may perform a semiconductor process on the substrate.

Further, the substrate transfer system according to some exemplary embodiments may include a lower rail LR, an upper rail UR, first transport units 110L and 110U, second transport units 120L and 120U, and a conveyor 130.

Each of the lower rail LR and the upper rail UR may be spaced apart from the ground plane of the semiconductor fabricating facility. For example, each of the lower rail LR and the upper rail UR may be suspended from and fixed to the ceiling of the semiconductor fabricating facility. The upper rail UR may be placed to be above the lower rail LR from the ground of the semiconductor fabricating facility. In some exemplary embodiments, the upper rail UR may extend parallel to the lower rail LR in the interface zone IZ. In some exemplary embodiments, the upper rail UR may overlap the lower rail LR in the interface zone IZ in a vertical direction. Here, the vertical direction refers to a direction in which gravity acts (i.e., a direction perpendicular to the ground of the semiconductor fabricating facility).

The first transport units 110L and 110U may load and unload the carrier 10 in the first fabricating facility F1 and the interface zone IZ. The first transport units 110L and 110U may include a first lower transport unit 110L and a first upper transport unit 110U. The first lower transport unit 110L may travel along the lower rail LR extending over the first fabricating facility F1 and the interface zone IZ, and the first upper transport unit 110U may travel along the upper rail UR extending over the first fabricating facility F1 and the interface zone IZ. As a result, the first transport units 110L and 110U may transport the carriers 10 between the first fabricating facility F1 and the interface zone IZ.

In some exemplary embodiments, the first lower transport unit 110L may include a first sub-lower transport unit 110L1 and a second sub-lower transport unit 110L2, which are spaced apart from each other and each travel on the lower rail LR. Although only an example in which the traveling directions of the first sub-lower transport unit 110L1 and the second sub-lower transport unit 110L2 are different from each other is shown, this is only an example, and the transport units may travel in the same direction as each other.

In some exemplary embodiments, the first upper transport unit 110U may include a first sub-upper transport unit 110U1 and a second sub-upper transport unit 110U2, which are spaced apart from each other and each travel on the upper rail UR. Although only an example in which the traveling directions of the first sub-upper transport unit 110U1 and the second sub-upper transport unit 110U2 are different from each other is shown, this is only one example, and the transport units may travel in the same direction as each other.

The second transport units 120L and 120U may load and unload the carriers 10 in the second fabricating facility F2 and the interface zone IZ. The second transport units 120L and 120U may include a second lower transport unit 120L and a second upper transport unit 120U. The second lower transport unit 120L may travel along the lower rail LR extending over the second fabricating facility F2 and the interface zone IZ, and the second upper transport unit 120U may travel along the upper rail UR extending over the second fabricating facility F2 and the interface zone IZ. As a result, the second transport units 120L and 120U may transport the carriers 10 between the second fabricating facility F2 and the interface zone IZ.

In some exemplary embodiments, the second lower transport unit 120L may include a third sub-lower transport unit 120L1 and a fourth sub-lower transport unit 120L2, which are spaced apart from each other and each travel on the lower rail LR. Although only an example in which the traveling directions of the third sub-lower transport unit 120L1 and the fourth sub-lower transport unit 120L2 are different from each other is shown, this is only one example, and the transport units may travel in the same direction as each other. Further, only an example in which the traveling directions of the first sub-lower transport unit 110L1 and the third sub-lower transport unit 120L1 are the same as each other, and the traveling directions of the second sub-lower transport unit 110L2 and the fourth sub-lower transport unit 120L2 are the same as each other, this is only one example, and the transport units may travel in different directions from each other.

In some exemplary embodiments, the second upper transport unit 120U may include a third sub-upper transport unit 120U1 and a fourth sub-upper transport unit 120U2, which are spaced apart from each other and each travel on the upper rail UR. Although only an example in which the traveling directions of the third sub-upper transport unit 120U1 and the fourth sub-upper transport unit 120U2 are different from each other, this is only one example, and the transport units may travel in the same direction. Further, although only an example in which the traveling directions of the first sub-upper transport unit 110U1 and the third sub-upper transport unit 120U1 are the same as each other, and the traveling directions of the second sub-upper transport unit 110U2 and the fourth sub-upper transport unit 120U2 are the same as each other, this is only one example, and the transport units may travel in different directions from each other.

The first transport units 110L and 110U and the second transport units 120L and 120U may each perform a loading operation or an unloading operation on the carrier 10. Therefore, the first transport units 110L and 110U may be provided with the carriers 10 from the first fabricating facility F1 or the conveyor 130, or may provide the carriers 10 to the first fabricating facility F1 or the conveyor 130. Further, the second transport units 120L and 120U may be provided with the carriers 10 from the second fabricating facility F2 or the conveyor 130, or may provide the carriers 10 to the second fabricating facility F2 or the conveyor 130.

As an example, as shown in FIG. 2, the first lower transport unit 110L may include a first cover portion 111a, a first transport portion 113a, a first elevating portion 115a, and a first grip portion 117a. In FIG. 2, although the first lower transport unit 110L is mainly described, it goes without saying that the second lower transport unit 120L may be similar.

The first cover portion 111a may provide a space for accommodating the first elevating portion 115a, the first grip portion 117a, and the carriers 10. The first transport portion 113a is placed on the lower rail LR and may move along the lower rail LR. As the first transport portion 113a moves, the carriers 10 accommodated in the first lower transport unit 110L may be transported along the lower rail LR. The first transport portion 113a may be, for example, but not limited to, a transfer vehicle that moves along the lower rail LR. The first elevating portion 115a may be placed inside the first cover portion 111a. The first elevating portion 115a may raise or lower the first grip portion 117a in the vertical direction VD. For example, the first elevating portion 115a may lower or raise the first grip portion 117a by loosening or winding a belt connected to the first grip portion 117a. The first grip portion 117a is attachable to and detachable from the carrier 10 to perform a loading operation or an unloading operation on the carrier 10.

A length of the first grip portion 117a raised and lowered in the vertical direction VD by the first elevating portion 115a may be, for example, about 1,000 mm or less (for example, about 100 mm to about 1,000 mm).

Further, as an example, as shown in FIG. 3, the first upper transport unit 110U may include a second cover portion 111b, a second transport portion 113b, a second elevating portion 115b, and a second grip portion 117b. In FIG. 3, although the first upper transport unit 110U is mainly described, it goes without saying that the second upper transport unit 120U may be similar.

The second cover portion 111b may provide a space for accommodating the second elevating portion 115b, the second grip portion 117b, and the carriers 10. The second transport portion 113b is placed on the upper rail UR and may move along the upper rail UR. As the second transport portion 113b moves, the carriers 10 accommodated in the second lower transport unit 120L may be transported along the upper rail UR. The second transport portion 113b may be, for example, but not limited to, a transfer vehicle that moves along the upper rail UR. The second elevating portion 115b may be placed inside the second cover portion 111b. The second elevating portion 115b may raise and lower the second grip portion 117b in the vertical direction VD. For example, the second elevating portion 115b may lower or raise the second grip portion 117b by loosening or winding the belt connected to the second grip portion 117b. The second grip portion 117b is attachable to and detachable from the carrier 10 to perform a loading operation or an unloading operation on the carrier 10.

A length of the second grip portion 117b raised or lowered in the vertical direction VD by the second elevating portion 115b may be greater than the raised or lowered length of the first grip portion 117a. For example, the length of the second grip portion 117b raised and lowered in the vertical direction VD by the second elevating portion 115b may be about 1,000 mm or more (for example, about 1,000 mm to about 2,000 mm).

In some exemplary embodiments, the first upper transport unit 110U and the second upper transport unit 120U may each perform a sliding operation on the carrier 10. As a result, even when the upper rail UR overlaps the lower rail LR in the vertical direction, the first upper transport unit 110U and the second upper transport unit 120U may be prevented from overlapping the first lower transport unit 110L and the second lower transport unit 120L.

As an example, as shown in FIG. 3, the first upper transport unit 110U may further include a slider 112b. In FIG. 3, although the first upper transport unit 110U is mainly shown, it goes without saying that the second upper transport unit 120U may be similar.

The slider 112b may slide the second elevating portion 115b placed in the second cover portion 111b in a horizontal direction HD intersecting the upper rail UR. The second grip portion 117b connected to the second elevating portion 115b may also slide in the horizontal direction HD. The sliding second elevating portion 115b may raise and lower the second grip portion 117b in the vertical direction VD. As a result, the second grip portion 117b may avoid an overlap with the lower rail LR and perform a loading operation or an unloading operation on the carrier 10.

A length at which the second grip portion 117b slides in the horizontal direction HD by the slider 112b may be, for example, about 440 mm or more (for example, about 440 mm to about 1,000 mm).

Although only an example in which the sliding operation is performed by the first upper transport unit 110U and the second upper transport unit 120U, the first lower transport unit 110L and the second lower transport unit 120L may also perform a predetermined sliding operation. As an example, the first lower transport unit 110L and the second lower transport unit 120L may each further include the slider 112b described above in connection with FIG. 3.

The length at which the first grip portion 117a slides in the horizontal direction HD by the slider 112b may be shorter than the length at which the second grip portion 117b slides. For example, the length at which the first grip portion 117a slides in the horizontal direction HD by the slider 112b may be about 440 mm or less (for example, about 100 mm to about 440 mm).

The conveyor 130 may be placed inside the interface zone IZ. The conveyor 130 may be placed below the lower rail LR. The lower rail LR and the upper rail UR may each intersect the conveyor 130 inside the interface zone IZ. For example, the conveyor 130 may extend to intersect the lower rail LR and the upper rail UR. In some exemplary embodiments, the conveyor 130 may be spaced apart from the ground plane of the semiconductor fabricating facility. For example, the conveyor 130 may be suspended from and fixed to the ceiling of a semiconductor fabricating facility. The lower rail LR may be placed above the conveyor 130 from the ground of the semiconductor fabricating facility.

The conveyor 130 may move the carriers 10 unloaded from the first transport units 110L and 110U and the second transport units 120L and 120U close to each other. As an example, the conveyor 130 may convey the carriers 10, which are unloaded from the first lower transport unit 110L and the first upper transport unit 110U, to the second lower transport unit 120L and the second upper transport unit 120U. Alternatively, for example, the conveyor 130 may convey the carriers 10, which are unloaded from the second lower transport unit 120L and the second upper transport unit 120U, to the first lower transport unit 110L and the first upper transport unit 110U. As a result, the conveyor 130 may exchange the carriers 10 of the first fabricating facility F1 with the carriers 10 of the second fabricating facility F2.

In some exemplary embodiments, the conveyor 130 may include a first conveyor 132 and a second conveyor 134 that move the unloaded carriers 10 in different linear directions from each other. As an example, as shown in FIG. 4, the first conveyor 132 may move the unloaded carriers 10 in the first linear direction MD1, and the second conveyor 134 may move the unloaded carriers 10 in a second linear direction MD2 opposite to the first linear direction MD1.

In some exemplary embodiments, the conveyor 130 may turn at least a part of the unloaded carriers 10. As an example, as shown in FIG. 4, the first conveyor 132 may include a first turning module 132T, and the second conveyor 134 may include a second turning module 134T. The first turning module 132T and the second turning module 134T may each reverse the facing direction of the carriers 10 by turning the unloaded carriers 10.

In some exemplary embodiments, the first conveyor 132 may include a first linear module 132L1, a first turning module 132T, and a second linear module 132L2. The first linear module 132L1 and the second linear module 132L2 may each move the unloaded carriers 10 in the first linear direction MD1. The first turning module 132T may be interposed between the first linear module 132L1 and the second linear module 132L2. The first turning module 132T may produce the carriers 10, which are provided from the first linear module 132L1, to the second linear module 132L2, by turning or without turning the carriers.

In some exemplary embodiments, the second conveyor 134 may include a third linear module 134L1, a second turning module 134T, and a fourth linear module 134L2. The third linear module 134L1 and the fourth linear module 134L2 may each move the unloaded carriers 10 in the second linear direction MD2. The second turning module 134T may be interposed between the third linear module 134L1 and the fourth linear module 134L2. The second turning module 134T may produce the carriers 10, which are provided from the third linear module 134L1, to the fourth linear module 134L2, by turning or without turning the carriers.

In some exemplary embodiments, the lower rail LR may include a first working rail LR1 and a first non-working rail LR2. The first working rail LR1 and the first non-working rail LR2 may extend parallel to each other in the interface zone IZ. The first transport units 110L and 110U and the second transport units 120L and 120U traveling on the first working rail LR1 may perform a loading operation or an unloading operation of the carriers 10 at a point where the transport units intersect the conveyor 130, respectively. The first transport units 110L and 110U and the second transport units 120L and 120U traveling on the first non-working rail LR2 may pass through the conveyor (130) without performing a loading operation or an unloading operation of the carrier 10. As a result, the first non-working rail LR2 may function as a lower high-speed rail that does not perform the distribution exchange in the interface zone IZ, from the plurality of lower rails LR.

In some exemplary embodiments, the upper rail UR may include a second working rail UR1 and a second non-working rail UR2. The second working rail UR1 and the second non-working rail UR2 may extend parallel to each other in the interface zone IZ. The first transport units 110L and 110U and the second transport units 120L and 120U traveling on the second working rail UR1 may each perform a loading operation or an unloading operation of the carrier 10 at a point where the transport units intersect the conveyor 130. The first transport units 110L and 110U and the second transport units 120L and 120U traveling on the second non-working rail UR2 may pass through the conveyor 130, without performing a loading operation or an unloading operation of the carriers 10. As a result, the second non-working rail UR2 may function as an upper high-speed rail that does not perform the distribution exchange in the interface zone IZ from the plurality of upper rails UR.

In the following description, the operation of the substrate transfer system according to exemplary embodiments will be described more specifically referring to FIGS. 5 to 15.

Figure 5:
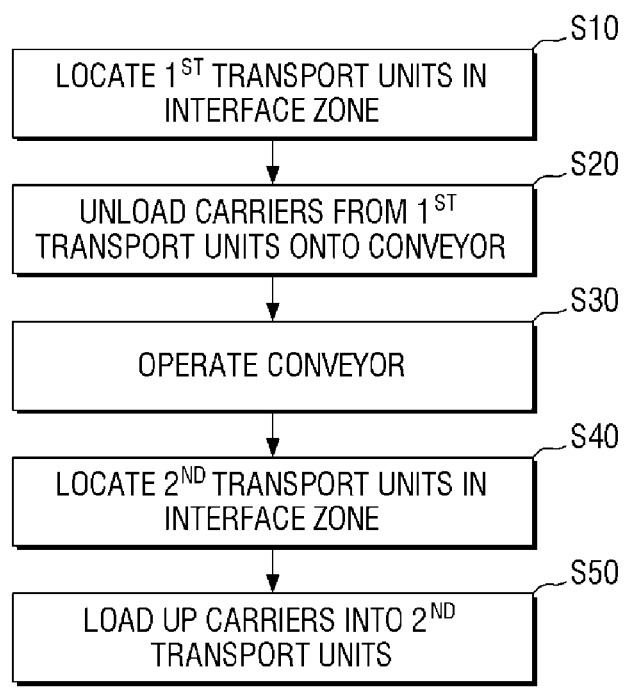
FIGS. 5 to 15 are diagrams for describing the operation of the substrate transfer system according to some exemplary embodiments.

FIGS. 5 to 15 are diagrams for describing the operation of the substrate transfer system according to some exemplary embodiments. For reference, FIG. 5 is a flowchart for describing the operation of the substrate transfer system according to some exemplary embodiments. Although FIGS. 5 to 15 mostly describe the distribution transported from the first fabricating facility F1 to the second fabricating facility F2, this is merely an example, and the person who has common knowledge in the technical field to which the present inventive concept pertains may easily understand the distribution transported from the second fabricating facility F2 to the first fabricating facility F1.

Figure 6:
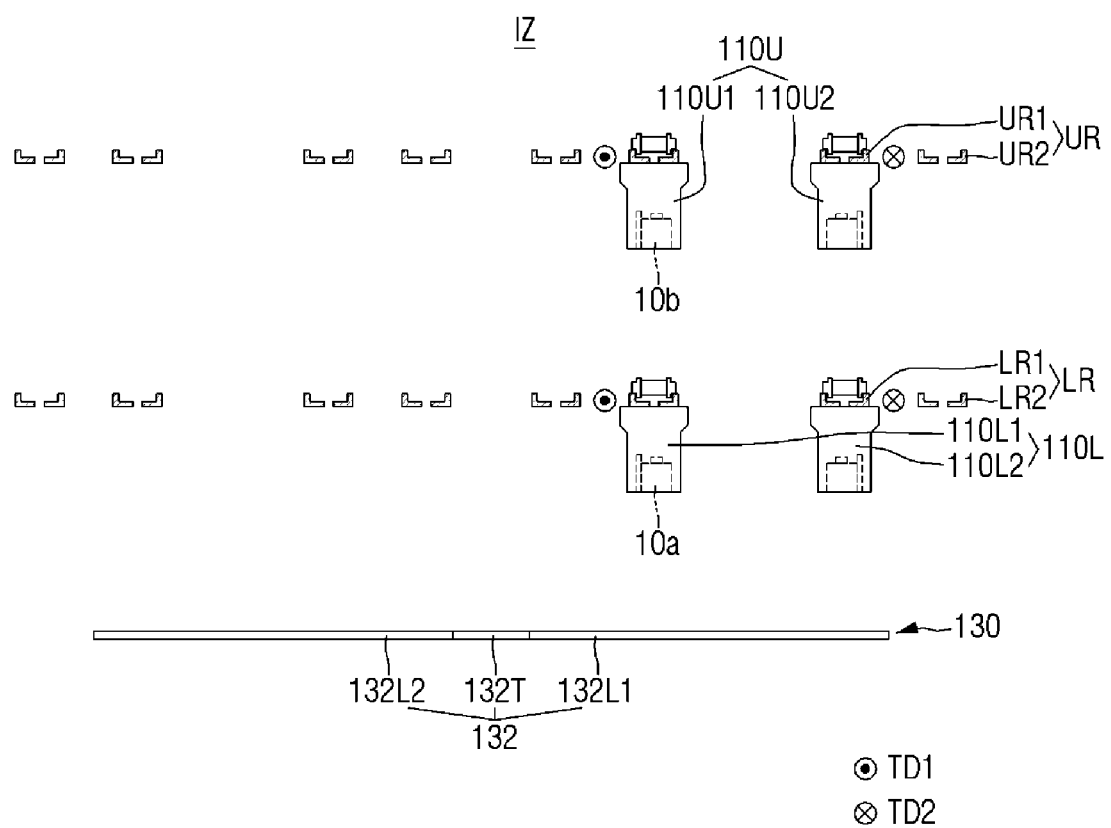
Figure 7:
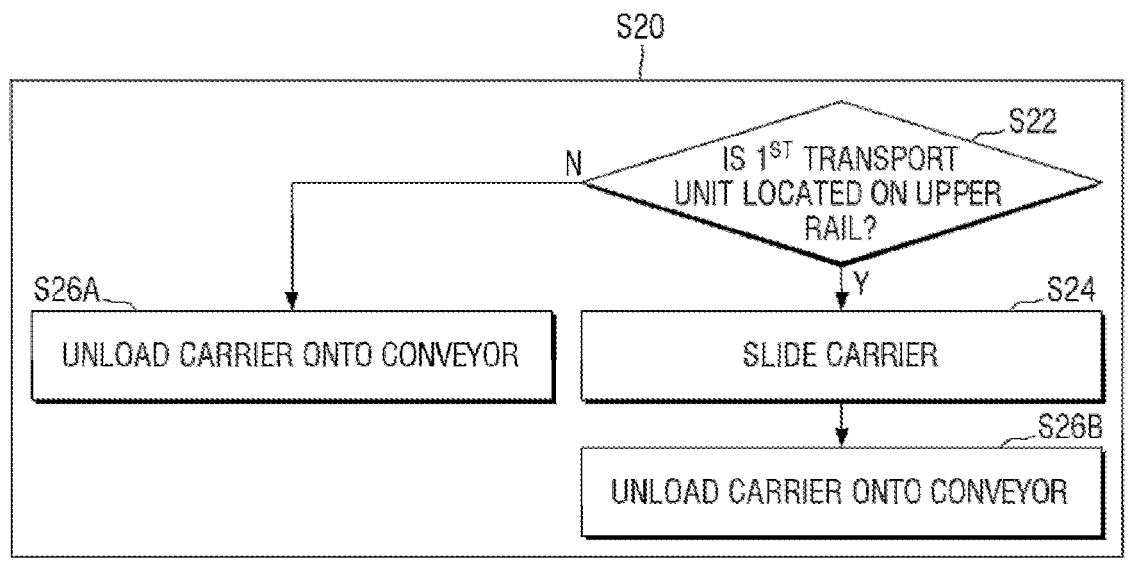
Figure 8:
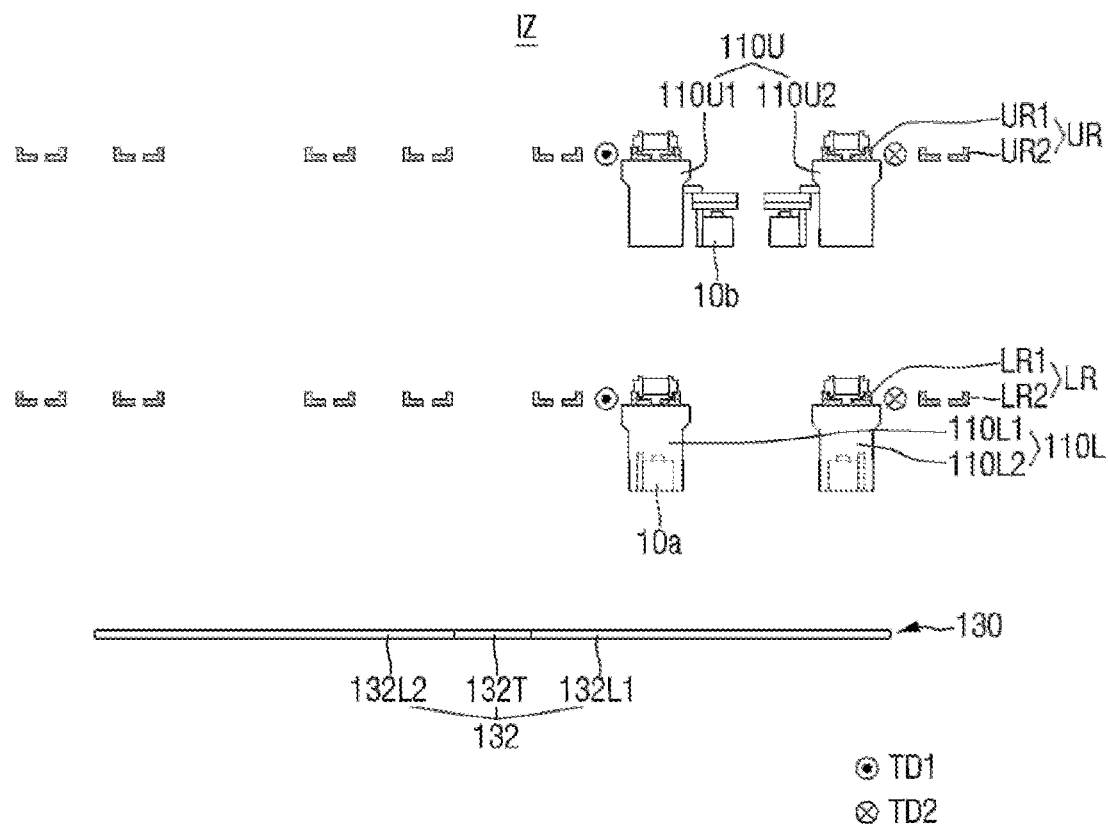

Referring to FIGS. 5 and 6, the first transport units 110L and 110U are located in the interface zone IZ (S10).

For example, the first lower transport unit 110L into which the first carrier 10a is loaded may travel along the first working rail LR1 of the lower rail LR and then stop at a point where it intersects the conveyor 130. Further, the first upper transport unit 110U into which the second carrier 10b is loaded may travel along the second working rail UR1 of the upper rail UR and then stop at a point where it intersects the conveyor 130.

FIG. 6 shows an example in which the first sub-lower transport unit 110L1 and the first sub-upper transport unit 110U1 each travel in the first traveling direction TD1 and then stop at the first linear module 132L1 of the first conveyor 132, and the second sub-lower transport unit 110L2 and the second sub-upper transport unit 110U2 each travel in the second travel direction TD2 opposite to the first travel direction TD1 and then stop at the first linear module 132L1 of the first conveyor 132.

Although not specifically shown, the first lower transport unit 110L traveling along the first non-working rail LR2 of the lower rail LR may travel continuously, without stopping in the interface zone IZ. As a result, the first lower transport unit 110L traveling along the first non-working rail LR2 may function as the lower high-speed transport unit. Further, the first upper transport unit 110U traveling along the second non-working rail UR2 of the upper rail UR may travel continuously, without stopping in the interface zone IZ. As a result, the first upper transport unit 110U traveling along the second non-working rail UR2 may function as the upper high-speed transport unit.

Referring to FIGS. 5 and 7 to 9, the carriers (the first carrier 10a and the second carrier 10b) are unloaded from the first transport units 110L and 110U onto the conveyor 130 (S20).

For example, the first lower transport unit 110L may unload the first carrier 10a onto the first linear module 132L1 of the first conveyor 132, and the first upper transport unit 110U may unload the second carrier 10b onto the first linear module 132L1 of the first conveyor 132.

In some exemplary embodiments, unloading (S20) of the first carrier 10a and the second carrier 10b onto the conveyor 130 may include a determination (S22) as to whether the first transport units 110L and 110U are placed on the upper rail UR.

Figure 9:
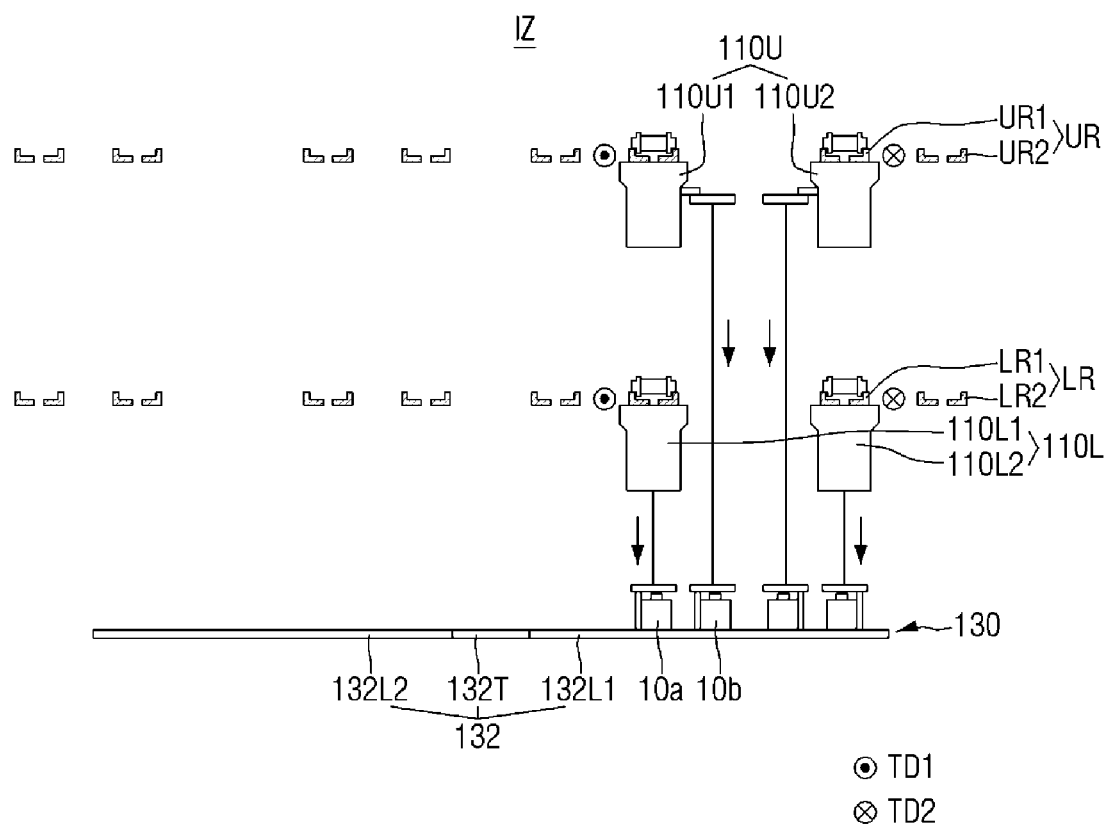

If the first transport units 110L and 110U are not the transport units placed on the upper rail UR (for example, if the first transport units 110L and 110U are not the first lower transport unit 110L), the first transport units 110L and 110U do not slide the first carrier 10a and unload the first carrier 10a onto the conveyor 130 (S26A) (see FIG. 9). As an example, as described above in FIG. 2, the first elevating portion 115a may lower the first grip portion 117a fastened to the first carrier 10a toward the conveyor 130. The first grip portion 117a may unload the first carrier 10a onto the conveyor 130 by releasing the fastening with the first carrier 10a. As a result, the first carrier 10a may be unloaded onto the first linear module 132L1 of the first conveyor 132.

If the first transport units 110L and 110U are transport units placed on the upper rail UR (for example, if the first transport units 110L and 110U are the first upper transport unit 110U), the first transport units 110L and 110U slide the second carrier 10b (S24) (see FIG. 8), and unload the second carrier 10b onto the conveyor 130 (S26B) (see FIG. 9). As an example, as described above in FIG. 3, the slider 112b may slide the second elevating portion 115b in the outward direction of the second cover portion 111b. The sliding second elevating portion 115b may lower the second grip portion 117b fastened to the carriers 10 toward the conveyor 130. The second grip portion 117b may unload the second carrier 10b onto the conveyor 130 by releasing the fastening with the carrier 10. Accordingly, the second carrier 10b may be unloaded onto the first linear module 132L1 of the first conveyor 132.

In some exemplary embodiments, the first carrier 10a and the second carrier 10b may be unloaded at the same time. For example, as shown in FIG. 9, the operation in which the first lower transport unit 110L unloads the first carrier 10a onto the first linear module 132L1 may be performed at the same time as the operation in which the first upper transport unit 110U unloads the second carrier 10b onto the first linear module 132L1.

Figure 10:
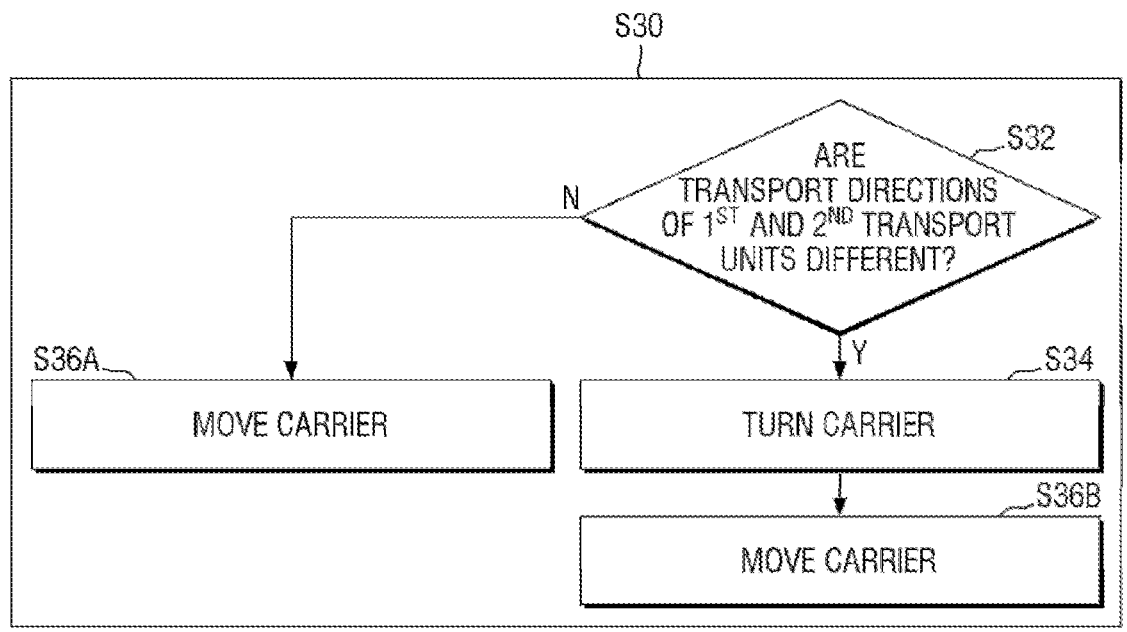
Figure 11:
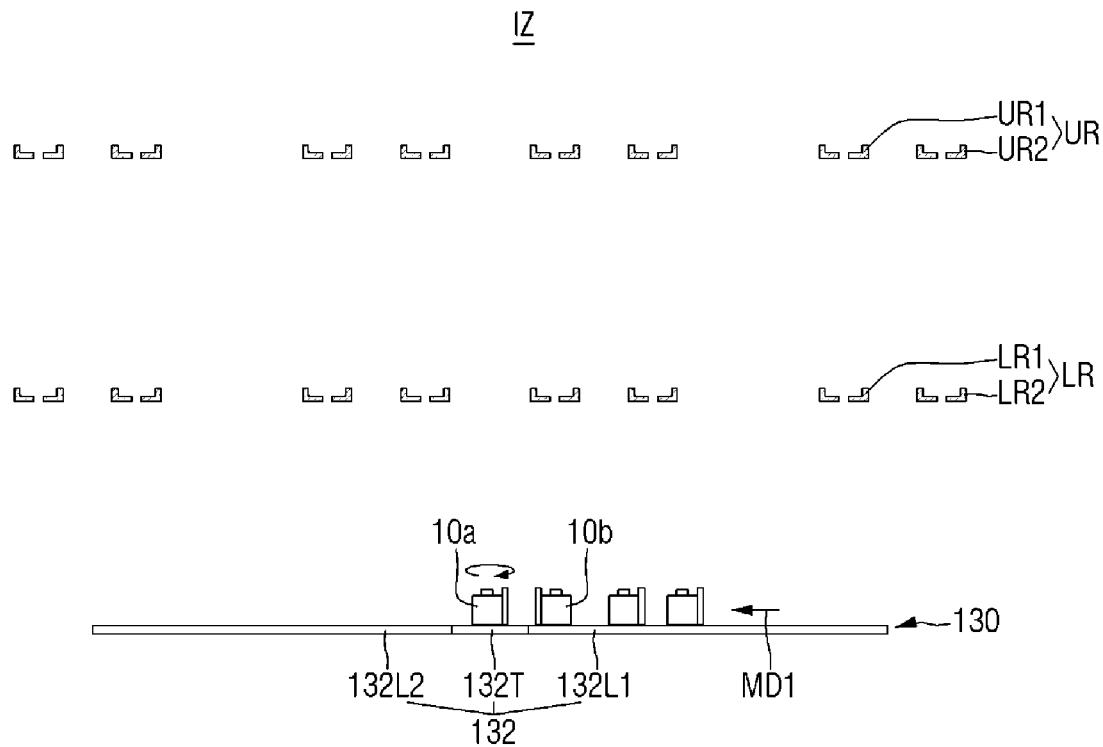

Referring to FIGS. 5, 10 and 11, the conveyor 130 is in operation (S30).

As the conveyor 130 is in operation, the first carrier 10a and the second carrier 10b unloaded onto the conveyor 130 may be moved. For example, the first conveyor 132 may move the unloaded first carrier 10a and second carrier 10b in the first linear direction MD1.

In some exemplary embodiments, operating (S30) the conveyor 130 may include a determination (S32) as to whether the traveling directions of the first transport units 110L and 110U are different from the traveling directions of the second transport units 120L and 120U.

If the traveling directions of the first transport units 110L and 110U are not different from the traveling directions of the second transport units 120L and 120U (for example, if the traveling direction of the first lower transport unit 110L is the same as the traveling direction of the second lower transport unit 120L), the carriers (the first carrier 10a or the second carrier 10b) are moved without turning (S36A). As an example, as described in FIG. 4, the first linear module 132L1 may move the unloaded first carrier 10a and second carrier 10b in the first linear direction MD1. The first turning module 132T may produce the first carrier 10a or the second carrier 10b, which is provided from the first linear module 132L1, to the second linear module 132L2 without turning. Therefore, the first carrier 10a or the second carrier 10b which is not reversed may be provided onto the second linear module 132L2. The second linear module 132L2 may move the first carrier 10a and the second carrier 10b, which are provided from the first turning module 132T, in the first linear direction MD1.

If the traveling directions of the first transport units 110L and 110U are different from the traveling directions of the second transport units 120L and 120U (for example, if the traveling direction of the first lower transport unit 110L is different from the traveling direction of the second lower transport unit 120L), the carriers (the first carrier 10a or the second carrier 10b) are turned (S34), and the carriers (the first carrier 10a or the second carrier 10b) are moved (S36B). As an example, as described above in FIG. 4, the first linear module 132L1 may move the unloaded first carrier 10a and second carrier 10b in the first linear direction MD1. The first turning module 132T may turn the first carrier 10a or the second carrier 10b provided from the first linear module 132L1, and may provide them to the second linear module 132L2. Accordingly, the reversed first carrier 10a or second carrier 10b may be provided onto the second linear module 132L2. The second linear module 132L2 may move the first carrier 10a and the second carrier 10b provided from the first turning module 132T in the first linear direction MD1.

Referring to FIGS. 5 and 12A to 12C, the second transport units 120L and 120U are located in the interface zone IZ (S40).

For example, the second lower transport unit 120L, into which the carrier is not loaded, may travel along the first working rail LR1 of the lower rail LR and then stop at a point where it intersects the conveyor 130. Further, the second upper transport unit 120U, into which the carrier is not loaded, may travel along the second working rail UR1 of the upper rail UR and then stop at a point where it intersects the conveyor 130.

Although not specifically shown, the second lower transport unit 120L traveling along the first non-working rail LR2 of the lower rail LR may travel continuously without stopping in the interface zone IZ. Accordingly, the second lower transport unit 120L traveling along the first non-working rail LR2 may function as the lower high-speed transport unit. Further, the second upper transport unit 120U traveling along the second non-working rail UR2 of the upper rail UR may travel continuously without stopping in the interface zone IZ. Accordingly, the second upper transport unit 120U traveling along the second non-working rail UR2 may function as the upper high-speed transport unit.

Figure 12A:
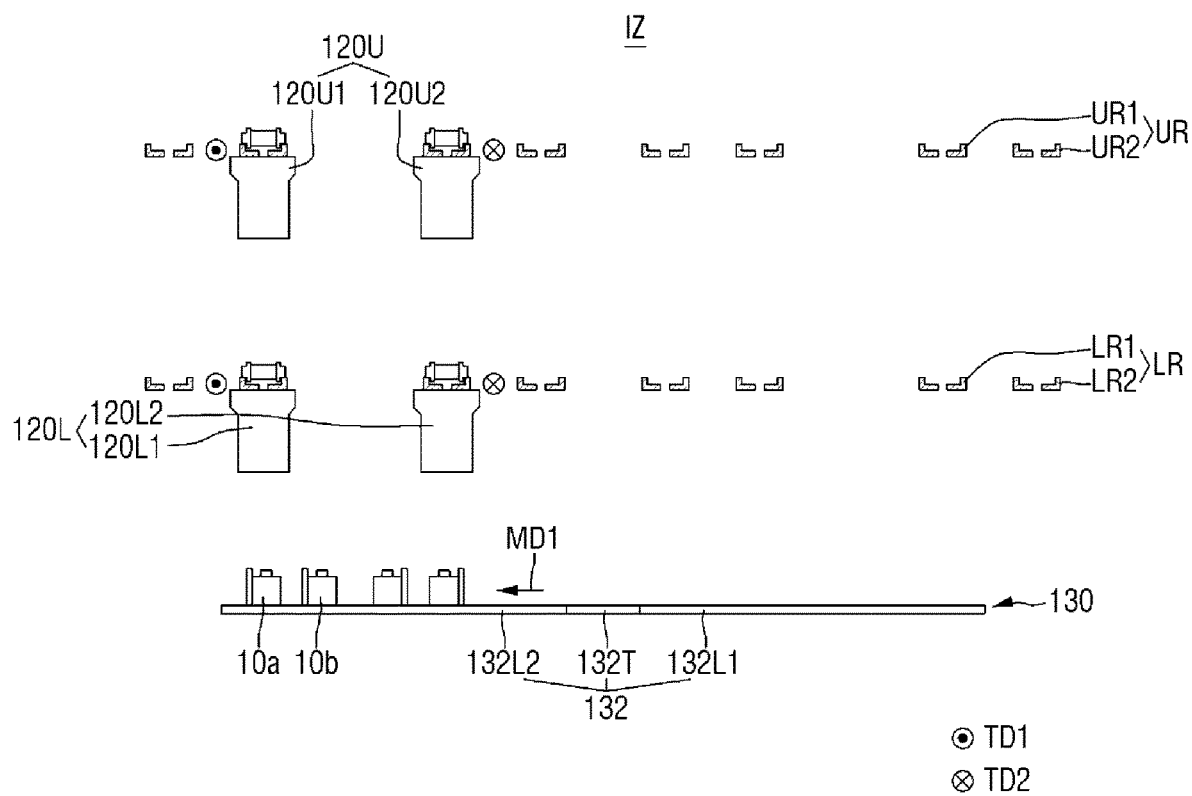

FIG. 12A shows an example in which the third sub-lower transport unit 120L1 and the third sub-upper transport unit 120U1 each travel in the first traveling direction TD1 and then stop on the second linear module 132L2 of the first conveyor 132, and the fourth sub-lower transport unit 120L2 and the fourth sub-upper transport unit 120U2 each travel in the second traveling direction TD2 and then stop on the second linear module 132L2 of the first conveyor 132.

As described above in FIGS. 10 and 11, if the traveling directions of the first transport units 110L and 110U are the same as the traveling directions of the second transport units 120L and 120U, the carriers (the first carrier 10a or the second carrier 10b) may not be reversed, and if the traveling directions of the first transport units 110L and 110U are different from the traveling directions of the second transport units 120L and 120U, the carriers (the first carrier 10a or the second carrier 10b) may be reversed. As an example, as shown in FIGS. 6 and 12A, since both traveling directions of the first sub-lower transport unit 110L1 and the third sub-lower transport unit 120L1 are the same as the first traveling direction TD1, the first turning module 132T may provide the first carrier 10a to the second linear module 132L2 without turning the first carrier 10a. As another example, since both traveling directions of the first sub-upper transport unit 110U1 and the third sub-upper transport unit 120U1 are the same as the first traveling direction TD1, the first turning module 132T may provide the second carrier 10b to the second linear module 132L2 without turning the second carrier 10b.

Figure 12B:
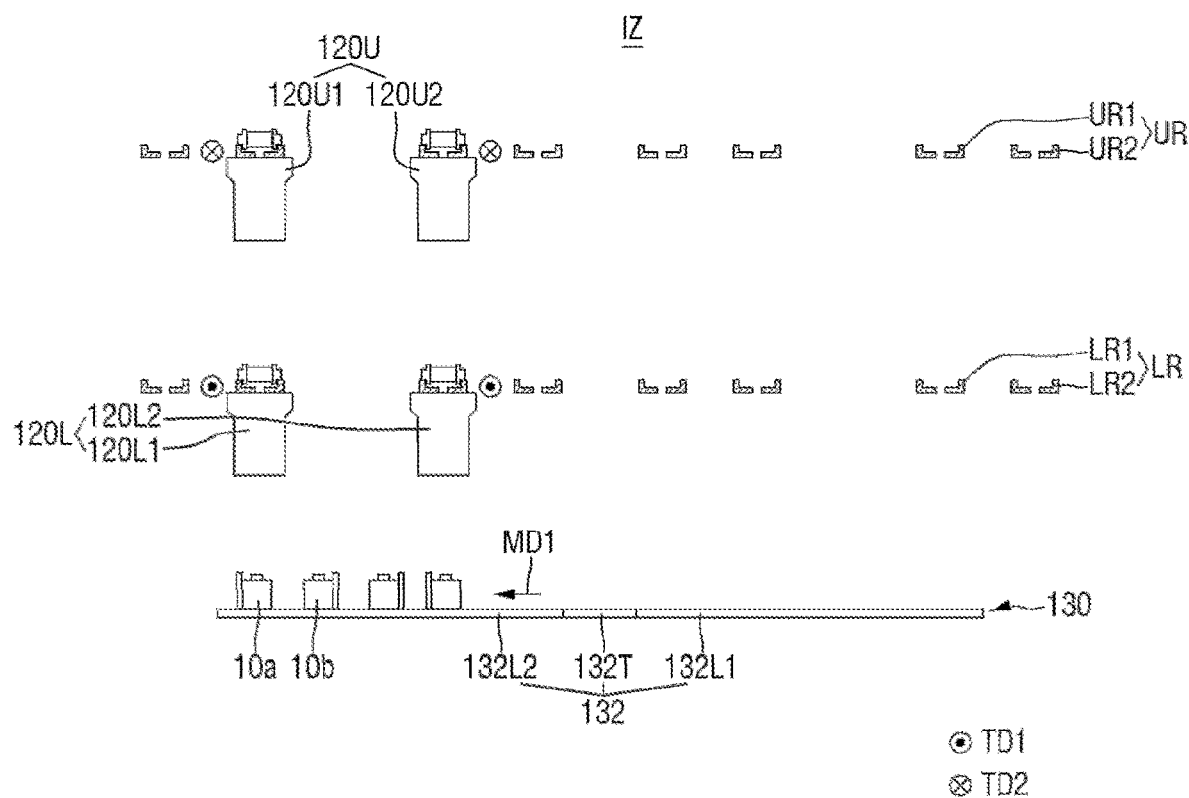

FIG. 12B shows an example in which all the second lower transport units 120L travel in the first traveling direction TD1 and then stop on the second linear module 132L2 of the first conveyor 132, and all the second upper transport units 120U travel in the second traveling direction TD2 and then stop on the second linear module 132L2 of the first conveyor 132.

As described above in FIGS. 10 and 11, if the traveling directions of the first transport units 110L and 110U and the second transport units 120L and 120U are the same, the carriers (the first carrier 10a or the second carrier 10b) may not be reversed, and if the traveling directions of the first transport units 110L and 110U and the second transport units 120L and 120U are different, the carriers (the first carrier 10a or the second carrier 10b) may be reversed. As an example, as shown in FIGS. 6 and 12B, since both the traveling directions of the first sub-lower transport unit 110L1 and the third sub-lower transport unit 120L1 are the same as the first traveling direction TD1, the first turning module 132T may provide the first carrier 10a to the second linear module 132L2 without turning the first carrier 10a. As another example, since the first traveling direction TD1 of the first sub-upper transport unit 110U1 and the second traveling direction TD2 of the third sub-upper transport unit 120U1 are different from each other, the first turning module 132T may turn the second carrier 10b and provide it to the second linear module 132L2.

Figure 12C:
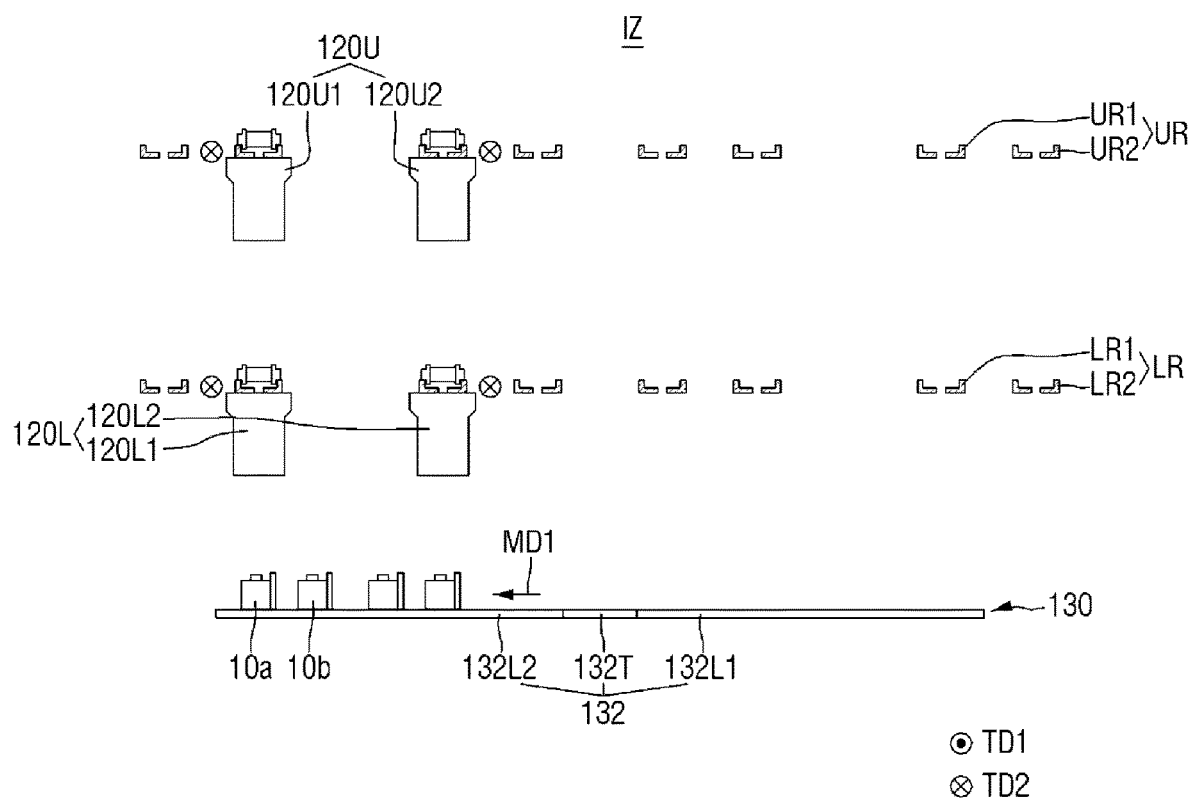

FIG. 12C shows an example in which both the second lower transport unit 120L and the second upper transport unit 120U travel in the second traveling direction TD2 and then stop at the second linear module 132L2 of the first conveyor 132.

As described above in FIGS. 10 and 11, if the traveling directions of the first transport units 110L and 110U and the second transport units 120L and 120U are the same, the carriers (the first carrier 10a or the second carrier 10b) may not be reversed, and if the traveling directions of the first transport units 110L and 110U and the second transport units 120L and 120U are different, the carriers (the first carrier 10a or the second carrier 10b) may be reversed. As an example, as shown in FIGS. 6 and 12C, since the first traveling direction TD1 of the first sub-lower transport unit 110L1 and the second traveling direction TD2 of the third sub-lower transport unit 120L1 are different from each other, the first turning module 132T may turn the first carrier 10a and provide it to the second linear module 132L2. As another example, since the first traveling direction TD1 of the first sub-upper transport unit 110U1 and the second traveling direction TD2 of the third sub-upper transport unit 120U1 are different from each other, the first turning module 132T may turn the second carrier 10b and provide it to the second linear module 132L2.

Referring to FIGS. 5 and 13 to 15, the carriers (the first carrier 10a and the second carrier 10b) are loaded from the conveyor 130 to the second transport units 120L and 120U (S50).

For example, the second lower transport unit 120L may load the first carrier 10a from the second linear module 132L2 of the first conveyor 132, and the second upper transport unit 120U may load the second carrier 10b from the second linear module 132L2 of the second conveyor 132.

In some exemplary embodiments, loading of the first carrier 10a and the second carrier 10b into the second transport units 120L and 120U may include determining whether the second transport units 120L and 120U are placed on the upper rail UR.

Figure 13:
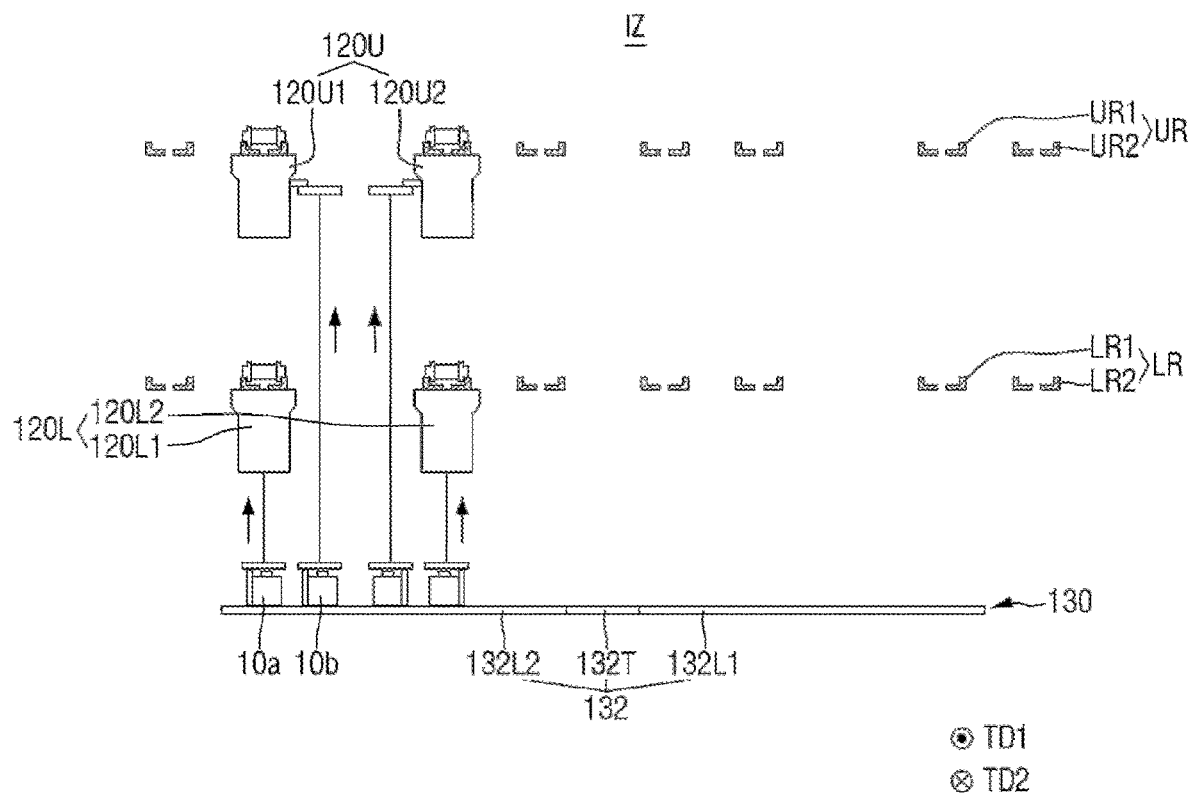
Figure 14:
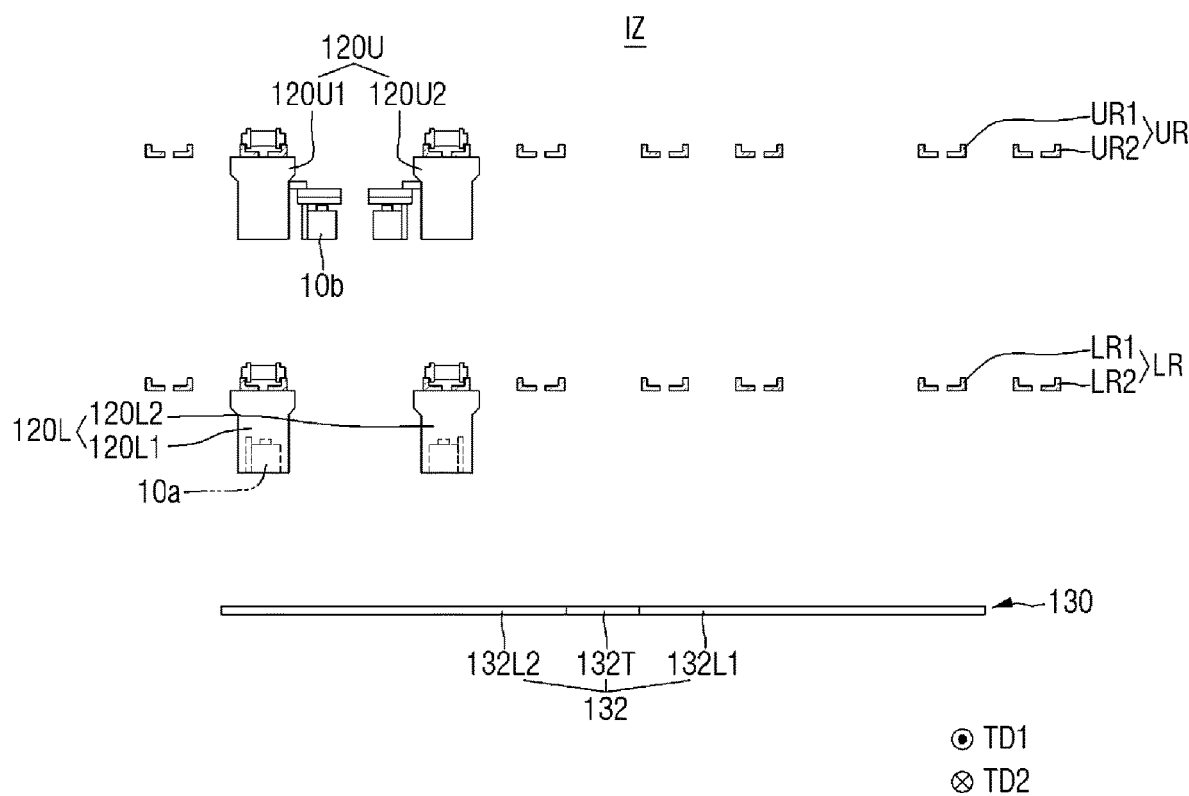

If the second transport units 120L and 120U are not transport units placed on the upper rail UR (for example, if the second transport units 120L and 120U are the second lower transport unit 120L), the first carrier 10a may be loaded without sliding (see FIGS. 13 and 14). As an example, as described above in FIG. 2, the first elevating portion 115a may lower the first grip portion 117a toward the conveyor 130 on which the first carrier 10a is placed, and the first grip portion 117a may be fastened to the first carrier 10a. The first elevating portion 115a may load the first carrier 10a from the conveyor 130, by raising the first elevating portion 115a fastened to the first carrier 10a. Accordingly, the first carrier 10a may be loaded from the second linear module 132L2 of the first conveyor 132.

Figure 15:
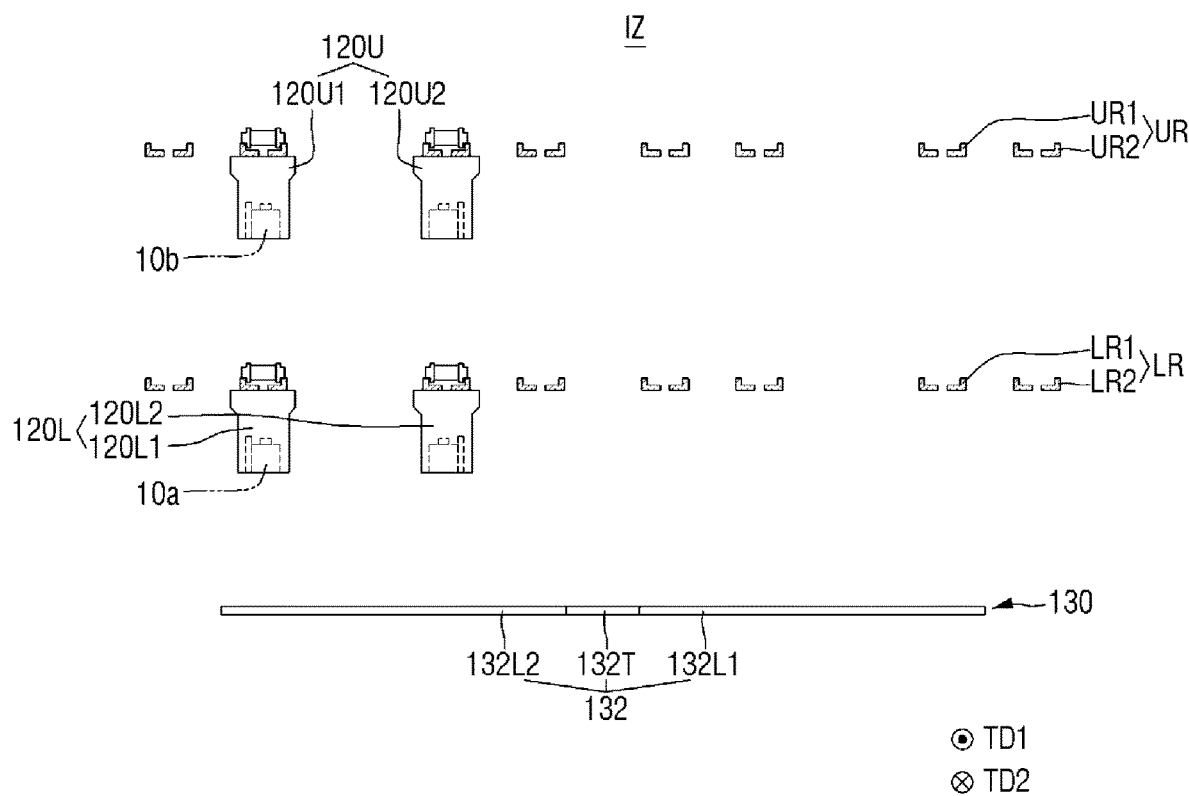

If the second transport units 120L and 120U are transport units placed on the upper rail UR (for example, if the second transport units 120L and 120U are the second upper transport unit 120U), the second carrier 10b may be slid and loaded (see FIGS. 13 to 15). As an example, as described above in FIG. 3, the slider 112b may slide the second elevating portion 115b in an outward direction of the second cover portion 111b. The sliding second elevating portion 115b may lower the second grip portion 117b toward the conveyor 130 on which the carriers 10 are placed, and the second grip portion 117b may be fastened to the carrier 10. The second elevating portion 115b raises the second elevating portion 115b fastened to the carriers 10, and the slider 112b may slide the second elevating portion 115b in an inward direction of the second cover portion 111b again. Accordingly, the second carrier 10b may be loaded from the second linear module 132L2 of the first conveyor 132.

In some exemplary embodiments, the first carrier 10a and the second carrier 10b may be loaded simultaneously. For example, as shown in FIG. 13, the operation in which the second lower transport unit 120L loads the first carrier 10a from the second linear module 132L2 may be performed at the same time as the operation in which the second upper transport unit 120U loads the second carrier 10b from the second linear module 132L2.

In order to maximize the capacity to handle different semiconductor elements and the effective area of equipment, a cluster type/cloud type fabricating facility (Cluster/Cluster FAB) that integrally produces semiconductor elements by connecting the plurality of fabricating facilities (FAB) to each other is required. However, at present, since the distribution control system divides the control system for each fabricating facility to minimize the production damage due to unexpected sudden failure, there is a problem in direct movement and transport between the fabricating facilities using the distribution transport device. Therefore, an efficient interface zone operation for distribution exchange between fabricating facilities is indispensable.

Since the substrate transfer system according to some exemplary embodiments includes the lower rail LR, the upper rail UR, the first transport units 110L and 110U, the second transport units 120L and 120U, and the conveyor 130 placed inside the interface zone IZ, efficient distribution exchange between the fabricating facilities is possible.

Specifically, as described above, the substrate transfer system according to some exemplary embodiments includes multi-layer rails (the lower rail LR and the upper rail UR) that overlap in the vertical direction, and thus, has an enhanced transport capacity, compared to a substrate transfer system including only a single rail. Further, in the substrate transfer system according to some exemplary embodiments, the conveyor 130 may be spaced apart from the ground of the semiconductor fabricating facility, it is possible to utilize the space more efficiently than other interface equipment (for example, a stocker) installed on the ground. Further, in the substrate transfer system according to some exemplary embodiments, since the conveyor 130 is simply made up of the linear modules (e.g., the first linear module 132L1 and the second linear module 132L2) and the turning module (e.g., the first turning module 132T), it has a reduced investment cost compared to other interface equipment (e.g., a stocker) that requires a lot of labor and is costly to install.

Figure 16:
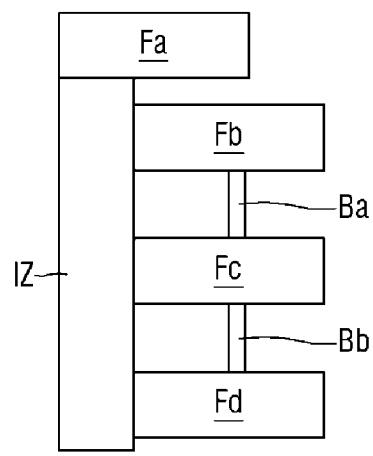
FIG. 16 is a schematic block diagram for describing a semiconductor fabricating facility including the substrate transfer system according to some exemplary embodiments.

FIG. 16 is a schematic block diagram for describing a semiconductor fabricating facility including the substrate transfer system according to some exemplary embodiments. For convenience of description, repeated parts of contents described above using FIGS. 1 to 15 will be either briefly described or omitted as redundant.

Referring to FIG. 16, the semiconductor fabricating facility according to some exemplary embodiments includes a plurality of fabricating facilities Fa, Fb, Fc and Fd and an interface zone IZ.

Each of the plurality of fabricating facilities Fa, Fb, Fc and Fd may be connected to the interface zone IZ. Each of the fabricating facilities Fa, Fb, Fc and Fd may correspond to the first fabricating facility F1 or the second fabricating facility F2 described above using FIGS. 1 to 15. The interface zone IZ may perform the distribution exchange between the fabricating facilities Fa, Fb, Fc and Fd. For example, the interface zone IZ may include the lower rail LR, the upper rail UR, the first transport units 110L and 110U, the second transport units 120L and 120U, and the conveyor 130 described above using FIGS. 1 to 15.

The semiconductor fabricating facility according to some exemplary embodiments may further include bridge zones Ba and Bb. The bridge zones Ba and Bb may interconnect adjacent fabricating facilities from fabricating facilities Fa, Fb, Fc and Fd. For example, a first bridge zone Ba which connects the fabricating facility Fb and the fabricating facility Fc, and a second bridge zone Bb which connects the fabricating facility Fc and the fabricating facility Fd may be provided. The bridge zones Ba and Bb may perform the distribution exchange between the adjacent fabricating facilities among the fabricating facilities Fa, Fb, Fc and Fd. For example, the bridge zones Ba and Bb may also include the lower rail LR, the upper rail UR, the first transport units 110L and 110U, the second transport units 120L and 120U, and the conveyor 130 described above using FIGS. 1 to 15.

While the present inventive concept has been particularly shown and described with reference to exemplary embodiments thereof, it will be understood by those of skill in the art that various changes in form and modifications in details may be made therein without departing from the spirit and scope of the present inventive concept as defined by the following claims. It is therefore desired that the present exemplary embodiments be considered in all respects as illustrative and not restrictive, reference being made to the appended claims rather than the foregoing description to ascertain the scope of the invention.

What is claimed is:

1. A substrate transfer system comprising:
    a lower rail;
    an upper rail which is located to above the lower rail from a ground plane, and extends to be parallel to the lower rail;
    a conveyor which extends to intersect the lower rail and the upper rail, below the lower rail;
    a first lower transport unit which transports a first carrier along the lower rail between a first facility and an interface zone and unloads the first carrier onto the conveyor;
    a first upper transport unit which transports a second carrier along the upper rail between the first facility and the interface zone and unloads the second carrier onto the conveyor;
    a second lower transport unit which transports the first carrier along the lower rail between a second facility and the interface zone and loads the first carrier from the conveyor; and
    a second upper transport unit which transports the second carrier along the upper rail between the second facility and the interface zone and loads the second carrier from the conveyor,
    wherein the conveyor includes a linear module and a turning module, wherein the linear module moves the first carrier and the second carrier in a linear direction, and wherein the turning module rotates to turn the first carrier and the second carrier, and
    wherein the linear module includes a first linear module in which the first carrier and the second carrier are loaded from the first lower transport unit and the first upper transport unit in the interface zone, and a second linear module in which the first carrier and the second carrier are unloaded into the second lower transport unit and the second upper transport unit in the interface zone.

2. The substrate transfer system of claim 1, wherein the lower rail and the upper rail overlap in a vertical direction.

3. The substrate transfer system of claim 2, wherein the first upper transport unit includes a slider which slides the second carrier so as not to overlap the lower rail in the vertical direction.

4. The substrate transfer system of claim 1,
    wherein the turning module is interposed between the first linear module and the second linear module.

5. The substrate transfer system of claim 1, wherein the turning module operates, when a traveling direction of the first lower transport unit is different from a traveling direction of the second lower transport unit, or when a traveling direction of the first upper transport unit is different from a traveling direction of the second upper transport unit.

6. The substrate transfer system of claim 1, wherein the first lower transport unit unloads the first carrier, and at the same time, the first upper transport unit unloads the second carrier.

7. The substrate transfer system of claim 1, wherein each of the lower rail and the upper rail includes a working rail and a non-working rail extending to be parallel with each other, the first lower transport unit and the first upper transport unit traveling on the working rail unload the first carrier and the second carrier on the conveyor at a point on which the working rail and the conveyor intersect, and the first lower transport unit and the first upper transport unit traveling on the non-working rail do not unload the first carrier and the second carrier onto the conveyor.

8. A substrate transfer system comprising:

a lower rail;

a first lower transport unit which transports a first carrier along the lower rail;

an upper rail which is placed to above the lower rail from a ground plane and overlaps the lower rail in a vertical direction;

a first upper transport unit which transports a second carrier along the upper rail;

a conveyor on which the first carrier and the second carrier are loaded or unloaded, below the lower rail;

a second lower transport unit which transports the first carrier along the lower rail connecting a first facility and an interface zone and loads the first carrier from the conveyor; and a second upper transport unit which transports the second carrier connecting a second facility and the interface zone along the upper rail and loads the second carrier from the conveyor, wherein the conveyor includes a linear module and at least one turning module that rotates to turn the first carrier and the second carrier, wherein the linear module includes a first linear module in which the first carrier and the second carrier are loaded from the first lower transport unit and the first upper transport unit in the interface zone, and a second linear module in which the first carrier and the second carrier are unloaded into the second lower transport unit and the second upper transport unit in the interface zone, wherein the first lower transport unit includes a first grip portion which moves in the vertical direction to perform a loading operation or an unloading operation on the first carrier, and wherein the first upper transport unit includes a second grip portion which moves in the vertical direction to perform the loading operation or the unloading operation on the second carrier, and a slider which slides the second grip portion so as not to overlap the lower rail.

9. The substrate transfer system of claim 8, wherein the loading operation or the unloading operation on the first carrier is performed at the same time as the loading operation or the unloading operation on the second carrier.

10. The substrate transfer system of claim 8, wherein the first grip portion performs the loading operation or the unloading operation on the first carrier at a point on which the lower rail and the conveyor intersect, the slider slides the second grip portion at a point on which the upper rail and the conveyor intersect, and the second grip portion performs the loading operation or the unloading operation on the second carrier after being slid by the slider.

11. The substrate transfer system of claim 8, wherein the conveyor includes a first conveyor which moves the first carrier and the second carrier in a first linear direction, and a second conveyor which moves the first carrier and the second carrier in a second linear direction opposite to the first linear direction.

12. The substrate transfer system of claim 11, wherein each of the first conveyor and the second conveyor includes a turning module of the at least one turning module.

13. A substrate transfer system comprising:

a first fabricating facility;

a second fabricating facility; and an interface zone which connects the first fabricating facility and the second fabricating facility, wherein the interface zone includes:

a conveyor, a lower rail which intersects the conveyor, a first lower transport unit which transports a first carrier from the first fabricating facility to the interface zone along the lower rail and unloads the first carrier onto the conveyor, a second lower transport unit which loads the first carrier from the conveyor, and transports the first carrier from the interface zone to the second fabricating facility along the lower rail, an upper rail which is placed above the lower rail from a ground plane and overlaps the lower rail in a vertical direction, a first upper transport unit which transports a second carrier from the first fabricating facility along the upper rail and unloads the second carrier onto the conveyor, and a second upper transport unit which loads the second carrier from the conveyor and transports the second carrier to the second fabricating facility along the upper rail, wherein the conveyor includes a linear module and a turning module, wherein the linear module moves the first carrier and the second carrier in a linear direction, and wherein the turning module rotates to turn the first carrier and the second carrier, and wherein the linear module includes a first linear module in which the first carrier and the second carrier are loaded from the first lower transport unit and the first upper transport unit in the interface zone, and a second linear module in which the first carrier and the second carrier are unloaded into the second lower transport unit and the second upper transport unit in the interface zone.

14. The substrate transfer system of claim 13, wherein each of the first upper transport unit and the second upper transport unit includes a slider which slides the second carrier so as not to overlap the lower rail in the vertical direction.

15. The substrate transfer system of claim 13, wherein the turning module operates, when a traveling direction of the first lower transport unit is different from a traveling direction of the second lower transport unit, or when a traveling direction of the first upper transport unit is different from a traveling direction of the second upper transport unit.

16. The substrate transfer system of claim 13, wherein the turning module is interposed between the first linear module and the second linear module.

17. The substrate transfer system of claim 13, wherein the first lower transport unit unloads the first carrier, and at the same time, the first upper transport unit unloads the second carrier.

18. The substrate transfer system of claim 13, wherein the second lower transport unit loads the first carrier, and at the same time, the second upper transport unit loads the second carrier.

19. The substrate transfer system of claim 13, wherein each of the first carrier and the second carrier is a FOUP (Front Opening Unified Pod).

* * * * *